(12) United States Patent
Katrak

(10) Patent No.: US 11,065,963 B2
(45) Date of Patent: Jul. 20, 2021

(54) DIAGNOSTIC SYSTEM FOR A DC-DC VOLTAGE CONVERTER

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 498 days.

(21) Appl. No.: 16/044,755

(22) Filed: Jul. 25, 2018

(65) Prior Publication Data
US 2019/0039457 A1    Feb. 7, 2019

Related U.S. Application Data

(60) Provisional application No. 62/539,649, filed on Aug. 1, 2017.

(51) Int. Cl.
*B60L 3/00*    (2019.01)
*H02M 3/335*    (2006.01)
(Continued)

(52) U.S. Cl.
CPC ............. *B60L 3/003* (2013.01); *B60L 3/0038* (2013.01); *B60L 3/0084* (2013.01); *B60L 3/12* (2013.01);
(Continued)

(58) Field of Classification Search
CPC ........ H03M 1/12; H02H 7/1213; B60L 58/20; B60L 3/12; B60L 3/0084; B60L 3/0038; B60L 3/003; B60L 2210/10; H02M 3/3353; H02M 3/157; H02M 3/156; H02M 2007/4835; Y02T 10/72; Y02T 10/70
See application file for complete search history.

(56) References Cited

U.S. PATENT DOCUMENTS 9,270,157 B2 *   2/2016   Kondou ................... H02M 1/08
9,964,599 B2     5/2018   Katrak et al.
(Continued)

OTHER PUBLICATIONS

AllAboutCircuits, Karnaugh Maps, Truth Tables, and Boolean Expressions Chapter 8—Karnaugh Mapping., WaybackMachine, https://www.allaboutcircuits.com/textbook/digital/chpt-8/karnaugh-maps-truth-tables-boolean-expressions/., Jul. 31, 2016 (Year: 2016).*

(Continued)

*Primary Examiner* — Yoshihisa Ishizuka
(74) *Attorney, Agent, or Firm* — Buckert Patent & Trademark Law Firm PC; John F. Buckert

(57) ABSTRACT

A diagnostic system for a DC-DC voltage converter includes a microcontroller having a first diagnostic handler application and first and second applications. The first application sets a first non-recoverable diagnostic flag associated with the DC-DC voltage converter to a first encoded value having each nibble thereof selected from an odd Karnaugh set of binary values. The second application sets a second non-recoverable diagnostic flag to a second encoded value having each nibble thereof selected from an even Karnaugh set of binary values. The first diagnostic handler application sets a first master non-recoverable diagnostic flag to a first encoded fault value if the first non-recoverable diagnostic flag is equal to a second encoded fault value, or the second non-recoverable diagnostic flag is equal to a third encoded fault value.

14 Claims, 9 Drawing Sheets

(51) Int. Cl.
*H02M 3/156* (2006.01)
*H03M 1/12* (2006.01)
*H02M 3/157* (2006.01)
*B60L 58/20* (2019.01)
*H02H 7/12* (2006.01)
*B60L 3/12* (2006.01)
*H02M 7/483* (2007.01)

(52) U.S. Cl.
CPC ........... *B60L 58/20* (2019.02); *H02H 7/1213* (2013.01); *H02M 3/156* (2013.01); *H02M 3/157* (2013.01); *H02M 3/3353* (2013.01); *H03M 1/12* (2013.01); *B60L 2210/10* (2013.01); *H02M 7/4835* (2021.05)

(56) References Cited

U.S. PATENT DOCUMENTS

| | | | | |
|---|---|---|---|---|
| 2002/0186778 | A1* | 12/2002 | Agami | H04L 1/0041 |
| | | | | 375/261 |
| 2004/0095081 | A1* | 5/2004 | Kernahan | H05B 41/2827 |
| | | | | 315/307 |
| 2004/0135544 | A1* | 7/2004 | King | B60W 10/26 |
| | | | | 320/116 |
| 2005/0135465 | A1* | 6/2005 | Andrus | H04L 25/4904 |
| | | | | 375/220 |
| 2007/0009066 | A1* | 1/2007 | Fredriksson | H03L 7/0812 |
| | | | | 375/326 |
| 2007/0016340 | A1* | 1/2007 | Soudier | B60L 3/04 |
| | | | | 701/1 |
| 2007/0109865 | A1* | 5/2007 | Maki | H03K 19/00338 |
| | | | | 365/185.22 |
| 2017/0363691 | A1 | 12/2017 | Katrak et al. | |
| 2017/0365996 | A1 | 12/2017 | Katrak et al. | |
| 2018/0034263 | A1 | 2/2018 | Katrak et al. | |
| 2018/0149711 | A1 | 5/2018 | Katrak et al. | |

OTHER PUBLICATIONS

U.S. Appl. No. 15/910,422, filed Mar. 2, 2018 entitled Diagnostic System for a DC-DC Voltage Converter.

* cited by examiner

| | ENCODED FAULT VALUE (HEXADECIMAL) | ENCODED NON-FAULT VALUE (HEXADECIMAL) |
|---|---|---|
| FIRST NON-RECOVERABLE DIAGNOSTIC FLAG | ED41 | B714 |

| FLAG | ENCODED FAULT VALUE (HEXADECIMAL) | ENCODED NON-FAULT VALUE (HEXADECIMAL) |
|---|---|---|
| SECOND NON-RECOVERABLE DIAGNOSTIC FLAG | 53C9 | 359C |

| FLAG | ENCODED FAULT VALUE (HEXADECIMAL) | ENCODED NON-FAULT VALUE (HEXADECIMAL) |
|---|---|---|
| FIRST RECOVERABLE DIAGNOSTIC FLAG | 5AA5 | A55A |

| FLAG | ENCODED FAULT VALUE (HEXADECIMAL) | ENCODED NON-FAULT VALUE (HEXADECIMAL) |
|---|---|---|
| FIRST MASTER NON-RECOVERABLE DIAGNOSTIC FLAG | 2BD1 | B21D |

| FLAG | ENCODED FAULT VALUE (HEXADECIMAL) | ENCODED NON-FAULT VALUE (HEXADECIMAL) |
|---|---|---|
| FIRST MASTER RECOVERABLE DIAGNOSTIC FLAG | E847 | 8E74 |

DIAGNOSTIC SYSTEM FOR A DC-DC VOLTAGE CONVERTER

CROSS-REFERENCE TO RELATED APPLICATION

This application claims priority to U.S. Provisional Patent Application No. 62/539,649 filed on Aug. 1, 2017, the entire contents of which are hereby incorporated by reference herein.

BACKGROUND

The inventor herein has recognized a need for an improved diagnostic system for a DC-DC voltage converter that utilizes non-recoverable diagnostic flags having each nibble thereof selected from an odd Karnaugh set of binary values, and non-recoverable diagnostic flags having each nibble thereof selected from an even Karnaugh set of binary values to allow freedom from interference among the diagnostic flags.

SUMMARY

A diagnostic system for a DC-DC voltage converter in accordance with an exemplary embodiment is provided. The diagnostic system includes a microcontroller having a first diagnostic handler application and first and second applications. The first application sets a first non-recoverable diagnostic flag associated with the DC-DC voltage converter to a first encoded value and sends the first non-recoverable diagnostic flag to the first diagnostic handler application. The first encoded value has each nibble thereof selected from an odd Karnaugh set of binary values. The second application sets a second non-recoverable diagnostic flag associated with the DC-DC voltage converter to a second encoded value and sends the second non-recoverable diagnostic flag to the first diagnostic handler application. The second encoded value has each nibble thereof selected from an even Karnaugh set of binary values. The first diagnostic handler application sets a first master non-recoverable diagnostic flag associated with the DC-DC voltage converter to a first encoded fault value if the first non-recoverable diagnostic flag is equal to a second encoded fault value, or the second non-recoverable diagnostic flag is equal to a third encoded fault value.

BRIEF DESCRIPTION OF THE DRAWINGS

FIG. 3 is a table having a fault value and a non-fault value for a first non-recoverable diagnostic flag utilized by the first application in FIG. 2;

FIG. 4 is a table having a fault value and a non-fault value for a second non-recoverable diagnostic flag utilized by the second application in FIG. 2;

FIG. 5 is a table having a fault value and a non-fault value for a first recoverable diagnostic flag utilized by the third application in FIG. 2;

FIG. 6 is a table having a fault value and a non-fault value for a first master non-recoverable diagnostic flag utilized by the first diagnostic handler application in FIG. 2;

FIG. 7 is a table having a fault value and a non-fault value for a first master recoverable diagnostic flag utilized by the first diagnostic handler application in FIG. 2;

DETAILED DESCRIPTION

Figure 1:
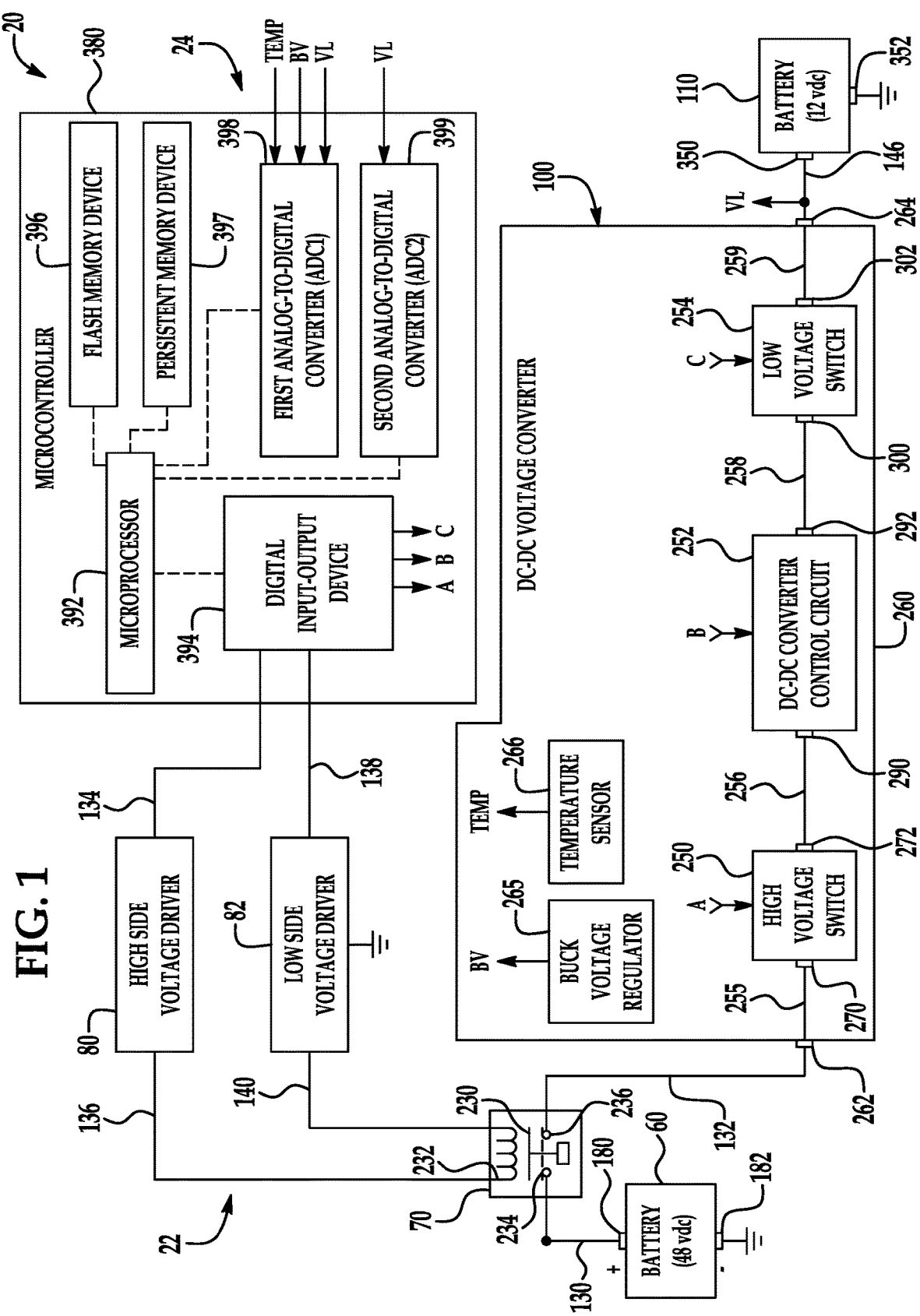
FIG. 1 is a schematic of a vehicle having a diagnostic system for a DC-DC voltage converter in accordance with an exemplary embodiment.

Referring to FIG. 1, a vehicle 20 is provided. The vehicle 20 includes a vehicle electrical system 22, and a diagnostic system 24 in accordance with an exemplary embodiment.

The vehicle electrical system 22 includes a battery 60, a contactor 70, a high side voltage driver 80, a low side voltage driver 82, a DC-DC voltage converter 100, a battery 110, a voltage regulator 114, and electrical lines 130, 132, 134, 136, 138, 140, 146.

An advantage of the diagnostic system 24 is that the system 24 utilizes non-recoverable diagnostic flags having each nibble thereof selected from an odd Karnaugh set of binary values, and non-recoverable diagnostic flags having each nibble thereof selected from an even Karnaugh set of binary values to allow freedom from interference among the diagnostic flags. Further, the system 24 utilizes recoverable diagnostic flags having each nibble thereof selected from an odd Karnaugh set of binary values, and recoverable diagnostic flags having each nibble thereof selected from an even Karnaugh set of binary values to allow freedom from interference among the diagnostic flags.

The term "node" or "electrical node" refers to a region or a location in an electrical circuit.

The term "IC" refers to an integrated circuit

The term "odd Karnaugh set of values" corresponds to numbers (decimal or hexadecimal) having corresponding binary numbers with an odd number of 0 bits and an odd number of 1 bits in a nibble. For example, the decimal numbers 1, 2, 4, 7, 8, 11, 13 and 14 are an odd Karnaugh set of values. In particular, the number 7 corresponds to a binary number 0111.

The term "even Karnaugh set of values" corresponds to numbers (decimal or hexadecimal) having corresponding binary numbers with an even number of 0 bits and an even number of 1 bits (for numbers greater than zero) in a nibble. For example, the decimal numbers 0, 3, 5, 6, 9, 10, 12 and 15 are an even Karnaugh set of values. In particular, the number 5 corresponds to a binary number 0101.

The term "non-recoverable diagnostic flag" refers to a flag which when set to encoded fault value induces the diagnostic system 24 to take safe action by transitioning a high voltage switch 250 and a low voltage switch 254 in the DC-DC voltage converter 100 to an open operational state, and to transition the contactor 70 to an open operational state to electrically de-couple the battery pack 20 from the vehicle electrical load 50. Further, thereafter, the diagnostic system 24 maintains the high voltage switch 250, the low voltage switch 254, and the contactor 70 in the open operational state even if the non-recoverable diagnostic flag is set to an encoded non-fault value.

The term "recoverable diagnostic flag" refers to a flag which when set to encoded fault value induces the diagnostic system 24 to take safe action by transitioning a high voltage switch 250 and a low voltage switch 254 in the DC-DC voltage converter 100 to an open operational state, and to transition the contactor 70 to an open operational state to electrically de-couple the battery pack 20 from the vehicle electrical load 50. Further, thereafter, the diagnostic system 24 can transition the high-voltage switch 250, the low voltage switch 254, and the contactor 70 to a closed operational state (e.g., recovers the closed operational state) if the recoverable diagnostic flag is set to an encoded non-fault value.

The battery 60 includes a positive terminal 180 and a negative terminal 182. In an exemplary embodiment, the battery 60 generates substantially 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the high voltage terminal 262 of the DC-DC voltage converter 100 utilizing the electrical line 132. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 144 energizes the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The DC-DC voltage converter 100 includes a high voltage switch 250, a DC-DC converter control circuit 252, a low voltage switch 254, electrical lines 255, 256, 258, 259, a housing 260, a high voltage terminal 262, a low voltage terminal 264, a buck voltage regulator 265, a temperature sensor 266. The housing 260 holds the high voltage switch 250, the DC-DC converter control circuit 252, and the low voltage switch 254 therein.

The high voltage switch 250 includes a first node 270 and a second node 272. The first node 270 is electrically coupled to the high voltage terminal 262 utilizing the electrical line 255, and the high voltage terminal 262 is further electrically coupled to the second node 236 of the contactor 70 utilizing the electrical line 132. The second node 272 is electrically coupled to a first node 290 of the DC-DC converter control circuit 252 utilizing the electrical line 256. In an exemplary embodiment, the high voltage switch 250 is a bi-directional MOSFET switch having desired voltage and current capabilities. When the microcontroller 380 generates a first control signal that is received by the high voltage switch 250 (or that is received by a controller or a microprocessor within the DC-DC voltage converter 100 that is operably coupled to the switch 250), the microcontroller 380 induces the switch 250 to transition to a closed operational state. When the microcontroller 380 generates a second control signal, the microcontroller 380 induces the switch 250 to transition to an open operational state. In an exemplary embodiment, the second control signal is a ground level control signal.

The DC-DC converter control circuit 252 has a first node 290 and a second node 292. The DC-DC converter control circuit 252 has internal FETs that are selectively switched to convert a DC voltage received at the first node 290 to another DC voltage output at the second node 292, based on control signals from the microcontroller 380. Alternately, the DC-DC converter control circuit 252 selectively switches the internal FETs to convert a DC voltage received at the second node 292 to another DC voltage that is output at the first node 290, based on control signals from the microcontroller 380.

The low voltage switch 254 includes a first node 300 and a second node 302. The first node 300 is electrically coupled to the second node 292 of the DC-DC converter control circuit 252 utilizing the electrical line 258. The second node 302 is electrically coupled to the low voltage terminal 264 utilizing the electrical line 259, and the low voltage terminal 264 is further electrically coupled to the battery 110 utilizing the electrical line 146. In an exemplary embodiment, the low voltage switch 254 has an identical structure as the high voltage switch 250. In an exemplary embodiment, the low voltage switch 254 is a bi-directional MOSFET switch having desired voltage and current capabilities. When the microcontroller 380 generates a first control signal that is received by the low voltage switch 254 (or that is received by a controller or a microprocessor within the DC-DC voltage converter 100 that is operably coupled to the switch 254), the microcontroller 380 induces the switch 254 to transition to a closed operational state. When the microcontroller 380 generates a second control signal, the microcontroller 380 induces the switch 254 to transition to an open operational state. In an exemplary embodiment, the second control signal is a ground level control signal.

The buck voltage regulator 265 provides a voltage to the DC-DC converter control circuit 252 during a buck mode of operation. The buck voltage regulator 265 is further electrically coupled to a first channel of the first analog-to-digital converter 398 which measures the output voltage thereof.

The temperature sensor 266 generates a temperature signal indicative of a temperature level of DC-DC voltage converter 100. The temperature sensor 266 is electrically coupled to a second channel of the first analog-to-digital converter 398 that measures an amplitude of the temperature signal and generates an associated temperature value.

The battery 110 includes a positive terminal 350 and a negative terminal 352. In an exemplary embodiment, the battery 110 generates substantially 12 Vdc between the positive terminal 350 and the negative terminal 352. The positive terminal 350 is electrically coupled to the low voltage terminal 264 of the DC-DC voltage converter 100. The negative terminal 352 is electrically coupled to an electrical ground, which may be electrically isolated from the electrical ground associated with the battery 60.

The diagnostic system 24 is provided to determine whether the DC-DC voltage converter 100 is operating as desired, and if not, to take safe action to by transitioning a contactor 70 to an open operational state, and to transition a high voltage switch 250 and a low voltage switch 254 in the DC-DC voltage converter 100 to an open operational state. The diagnostic system 24 includes the microcontroller 380 and the temperature sensor 266.

The microcontroller 380 is provided to determine whether the DC-DC voltage converter 100 is operating as desired, and if not, to take safe action as discussed above. The microcontroller 380 includes a microprocessor 392, a digital input-output device 394, a flash memory device 396, a persistent memory device 397, a first analog-to-digital converter 398, and a second analog-to-digital converter 399. The microprocessor 392 is operably coupled to the digital input-output device 394, the flash memory device 396, the persistent memory device 397, the first analog-to-digital converter 398, and the second analog-to-digital converter 399. The digital input-output device 394 is electrically coupled to the high side voltage driver 80 and the low side voltage driver 82 via the electrical lines 134, 138 respectively for controlling operation thereof. Further, the digital input-output device 394 is electrically coupled to the high voltage switch 250, the DC-DC converter control circuit 252, and the low voltage switch 254 for controlling operation thereof.

The first analog-to-digital converter 398 has a first channel that is electrically coupled to the buck voltage regulator 265 and measures an output voltage (BV) from the buck voltage regulator 265 to determine an associated output voltage value.

The first analog-to-digital converter 398 further includes a second channel that is electrically coupled to the temperature sensor 266 and measures an output signal (TEMP) from the temperature sensor 266 to determine an associated temperature level of the DC-DC voltage converter 100.

The first analog-to-digital converter 398 further includes a third channel that is electrically coupled to the output terminal 264 of the DC-DC voltage converter 100 and measures an output voltage (VL) from the DC-DC voltage converter 100 to determine an associated output voltage of the DC-DC voltage converter 100.

The second analog-to-digital converter 398 has a first channel that is electrically coupled to the output terminal 264 of the DC-DC voltage converter 100 and measures an output voltage (VL) from the DC-DC voltage converter 100 to determine an associated output voltage of the DC-DC voltage converter 100.

Figure 2:
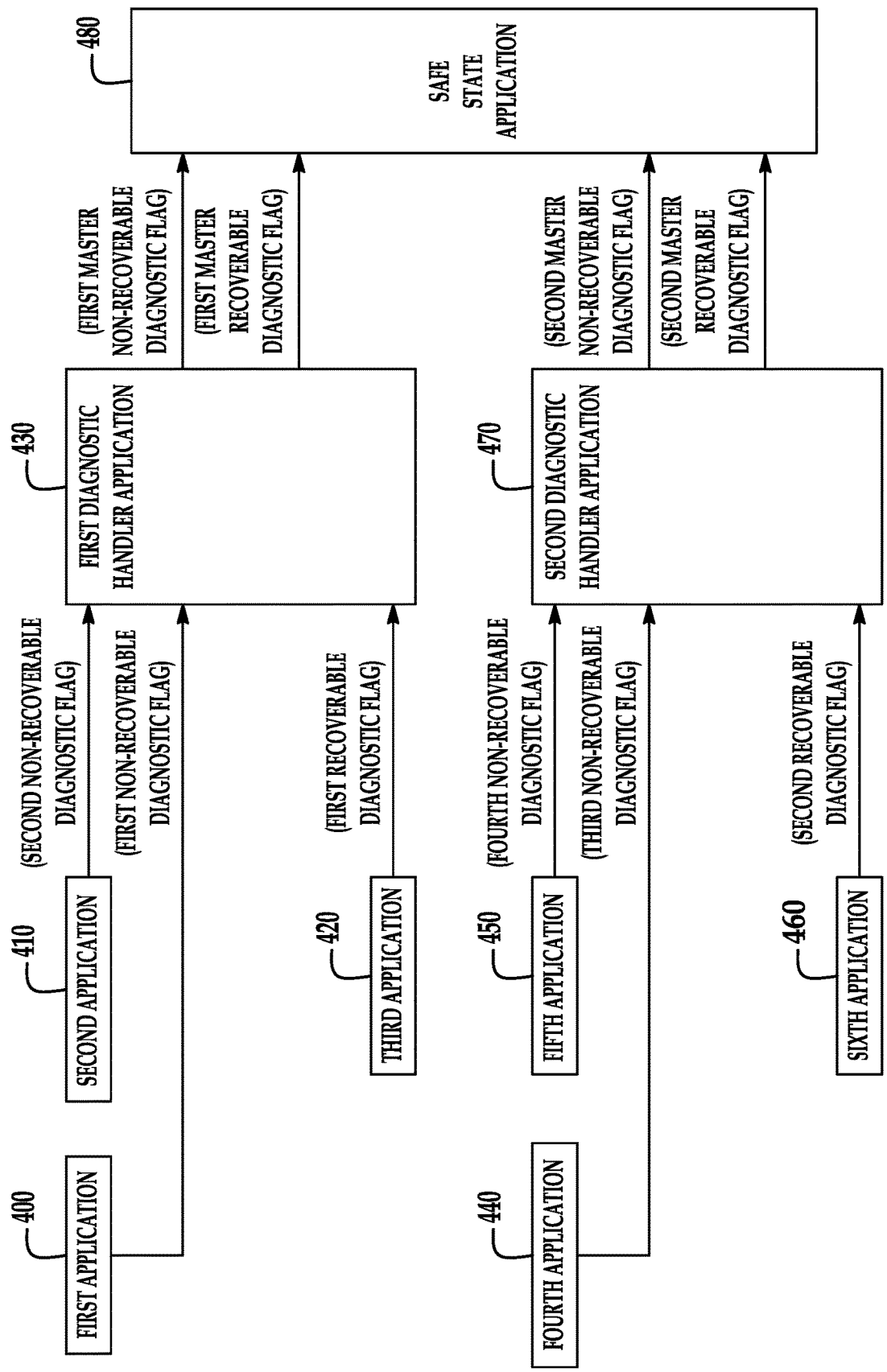
FIG. 2 is a block diagram of applications utilized by the diagnostic system of FIG. 1 including a first application, a second application, a third application, a first diagnostic handler application, a fourth application, a fifth application, a sixth application, a second diagnostic handler application, and a safe state application.

Referring to FIGS. 1 and 2, the flash memory device 396 includes a first application 400, a second application 410, a third application 420, a first diagnostic handler 430, the fourth application 440, a fifth application 450, a sixth application 460, a second diagnostic handler application 470, and a safe state application 480 which will be explained in greater detail below. The tables utilized by the above-identified applications will now be described.

Referring to FIGS. 2 and 3, a table 550 having a record 552 is illustrated. The record 552 has an encoded fault value (e.g., ED41 hexadecimal), and an encoded non-fault value (e.g., B714 hexadecimal) for a first non-recoverable diagnostic flag utilized by the first application 400 is illustrated.

Referring to FIGS. 2 and 4, a table 560 having a record 562 is illustrated. The record 562 has an encoded fault value (e.g., 53C9 hexadecimal), and an encoded non-fault value (e.g., 359C hexadecimal) for a second non-recoverable diagnostic flag utilized by the second application 410 is illustrated.

Referring to FIGS. 2 and 5, a table 570 having a record 572 is illustrated. The record 572 has an encoded fault value (e.g., 5AA5 hexadecimal), and an encoded non-fault value (e.g., A55A hexadecimal) for a first recoverable diagnostic flag utilized by the third application 420 is illustrated.

Referring to FIGS. 2 and 6, a table 580 having a record 582 is illustrated. The record 582 has an encoded fault value (e.g., 2BD1 hexadecimal), and an encoded non-fault value (e.g., B21D hexadecimal) for a first master non-recoverable diagnostic flag utilized by the first diagnostic handler application 430 is illustrated.

Referring to FIGS. 2 and 7, a table 590 having a record 592 is illustrated. The record 592 has an encoded fault value (e.g., E847 hexadecimal), and an encoded non-fault value (e.g., 8E74 hexadecimal) for a first master recoverable diagnostic flag utilized by the first diagnostic handler application 430 is illustrated.

Figure 8:
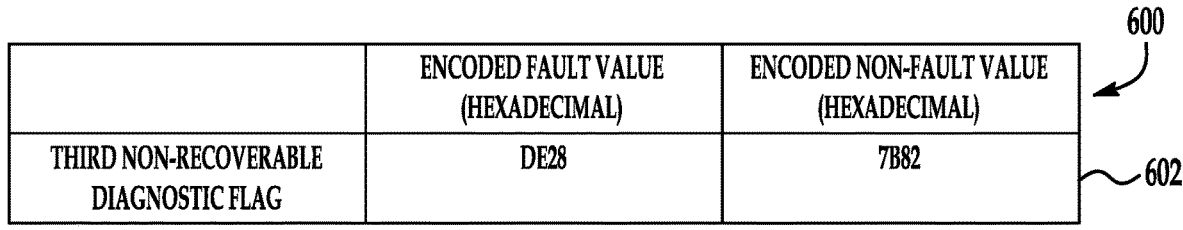
FIG. 8 is a table having a fault value and a non-fault value for a third non-recoverable diagnostic flag utilized by the fourth application in FIG. 2.

Referring to FIGS. 2 and 8, a table 600 having a record 602 is illustrated. The record 602 as an encoded fault value (e.g., DE28 hexadecimal), and an encoded non-fault value (e.g., 7B82 hexadecimal) for a third non-recoverable diagnostic flag utilized by the fourth application 440 is illustrated.

Figure 9:
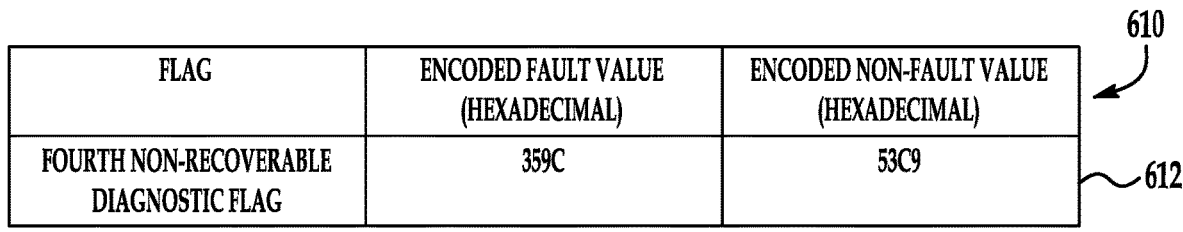
FIG. 9 is a table having a fault value and a non-fault value for a fourth non-recoverable diagnostic flag utilized by the fifth application in FIG. 2.

Referring to FIGS. 2 and 9, a table 610 having a record 612 is illustrated. The record 612 has an encoded fault value (e.g., 359C hexadecimal), and an encoded non-fault value (e.g., 53C9 hexadecimal) for a fourth non-recoverable diagnostic flag utilized by the fifth application 450 is illustrated.

Figure 10:
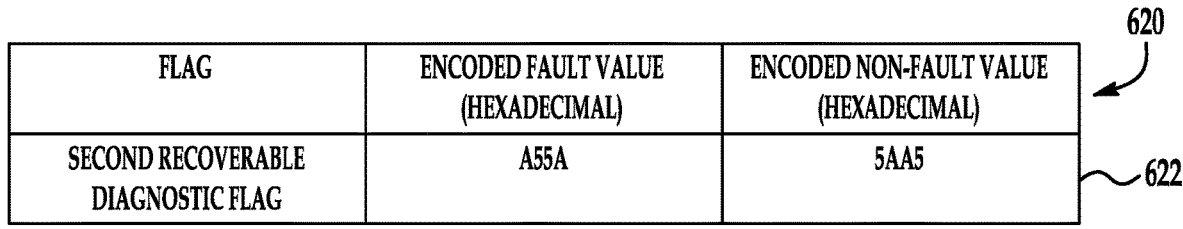
FIG. 10 is a table having a fault value and a non-fault value for a second recoverable diagnostic flag utilized by the sixth application in FIG. 2.

Referring to FIGS. 2 and 10, a table 620 having a record 622 is illustrated. The record 622 has an encoded fault value (e.g., A55A hexadecimal), and an encoded non-fault value (e.g., 5AA5 hexadecimal) for a second recoverable diagnostic flag utilized by the sixth application 460 is illustrated.

Figure 11:
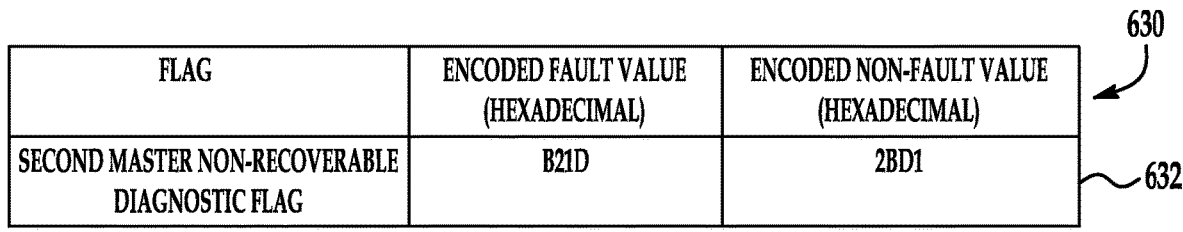
FIG. 11 is a table having a fault value and a non-fault value for a second master non-recoverable diagnostic flag utilized by the second diagnostic handler application in FIG. 2.

Referring to FIGS. 2 and 11, a table 630 having a record 632 is illustrated. The record 632 has an encoded fault value (e.g., B21D hexadecimal), and an encoded non-fault value (e.g., 2BD1 hexadecimal) for a second master non-recoverable diagnostic flag utilized by the second diagnostic handler application 470 is illustrated.

Figure 12:
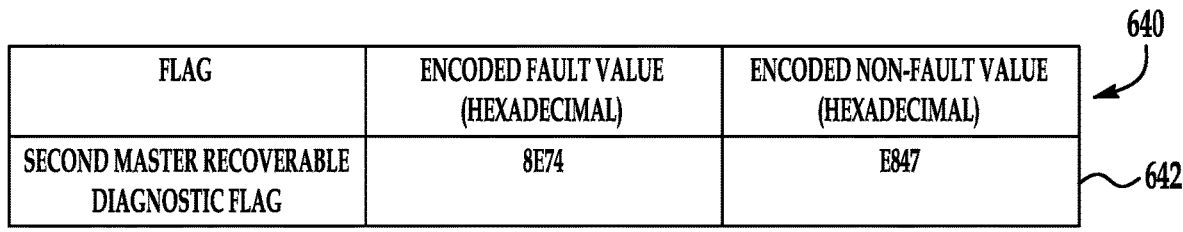
FIG. 12 is a table having a fault value and a non-fault value for a second master recoverable diagnostic flag utilized by the second diagnostic handler application in FIG. 2.
Figure 13:
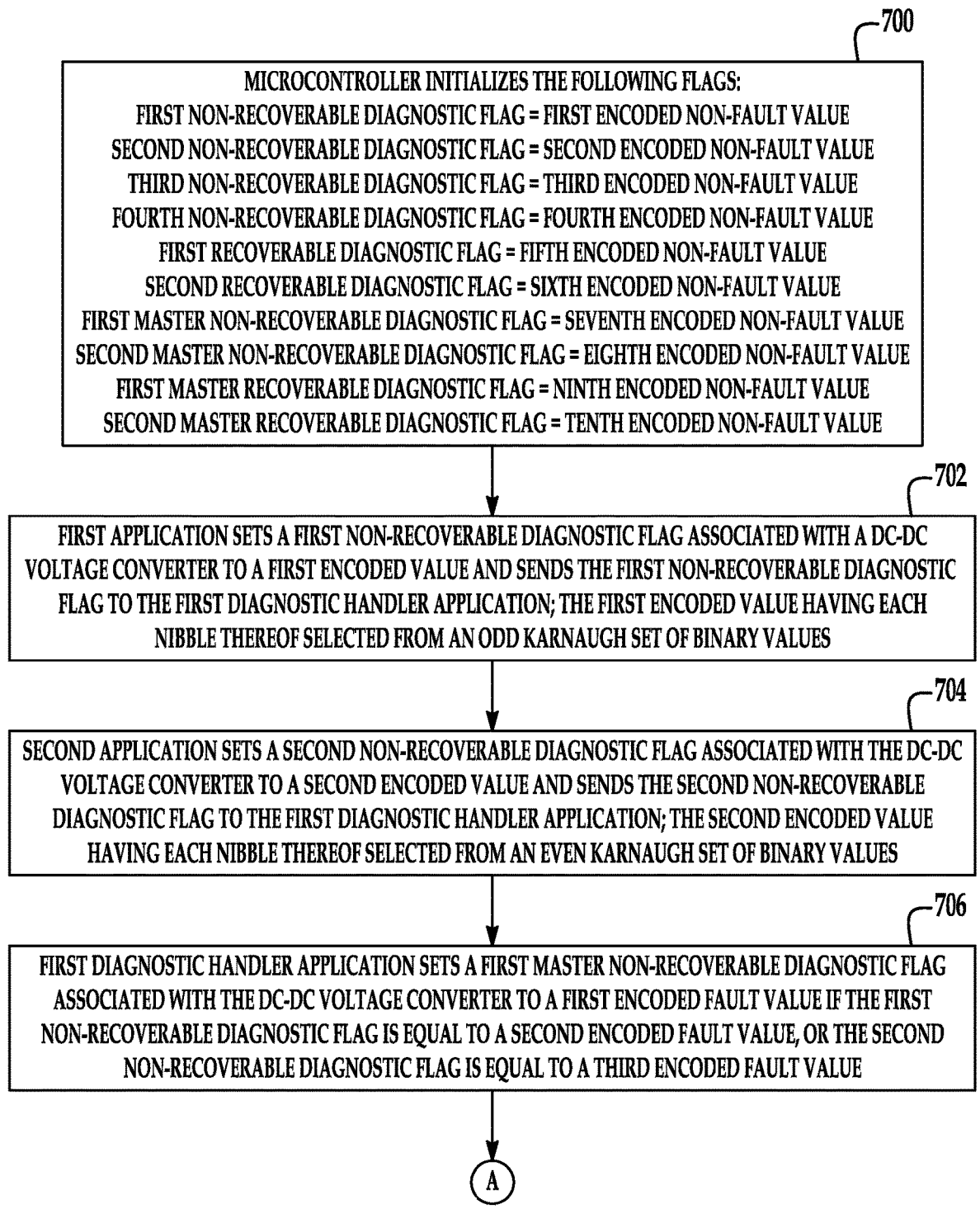
FIGS. 13-17 are flowcharts of a diagnostic method implemented by the battery management system of FIG. 1.
Figure 14:
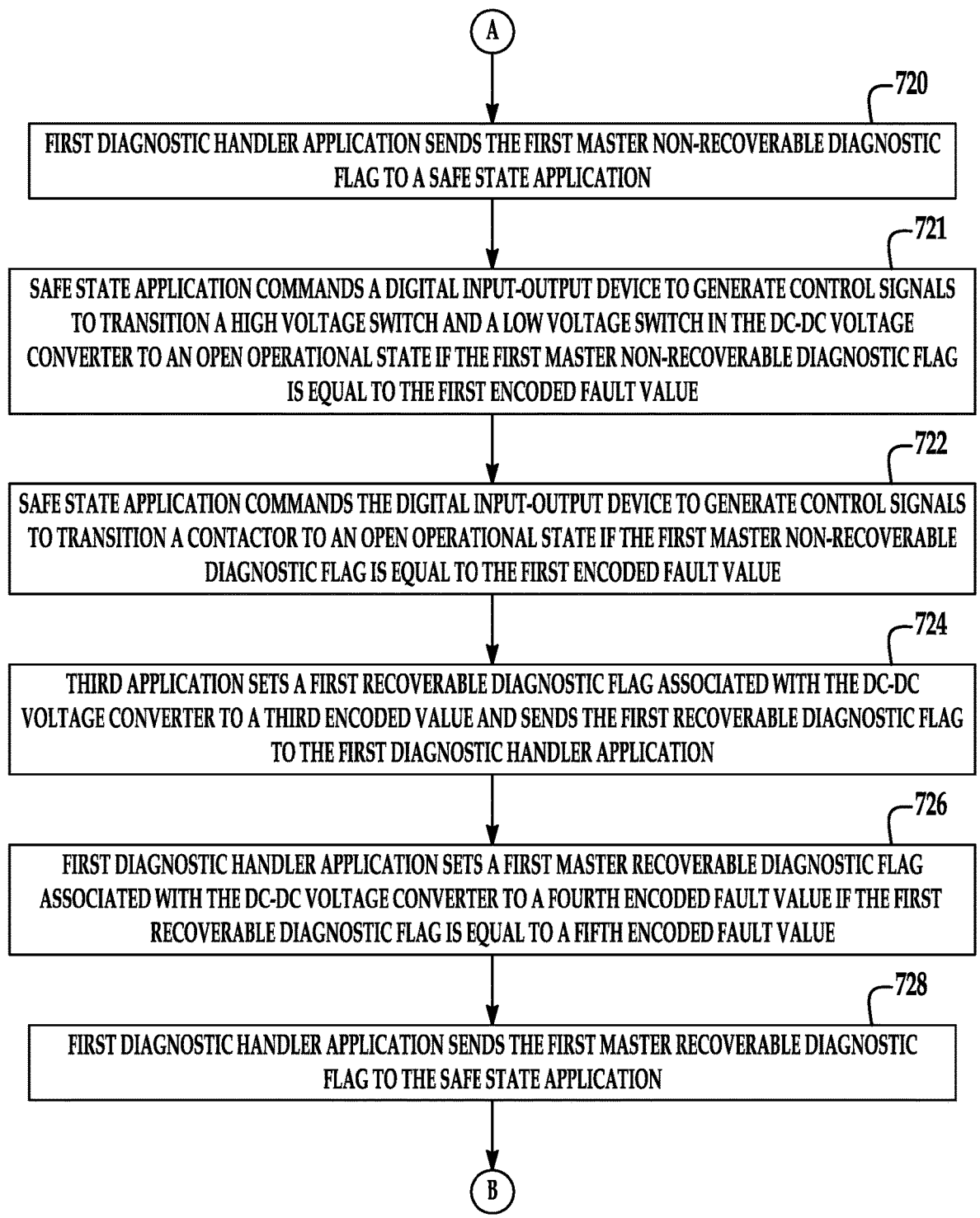
Figure 15:
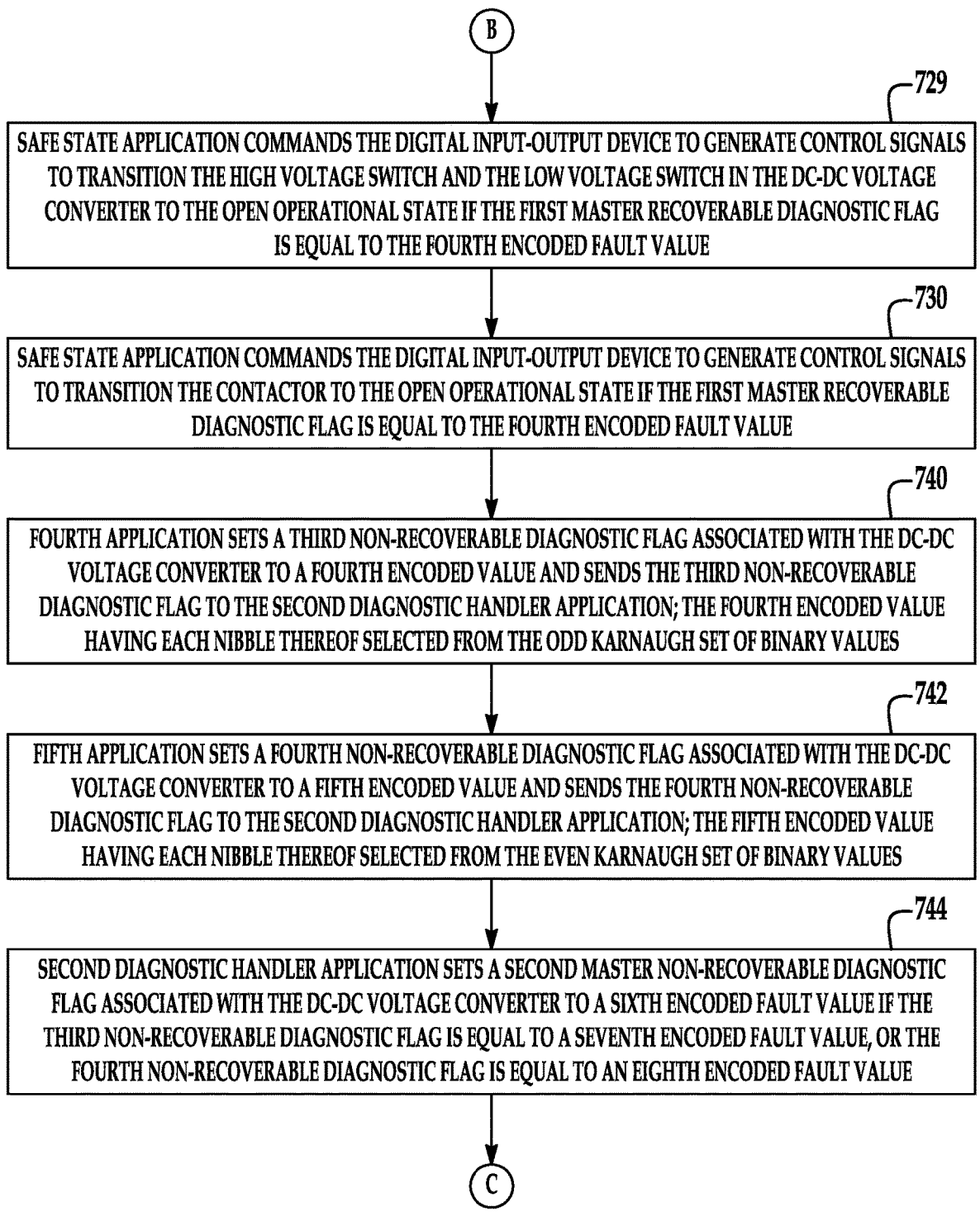
Figure 16:
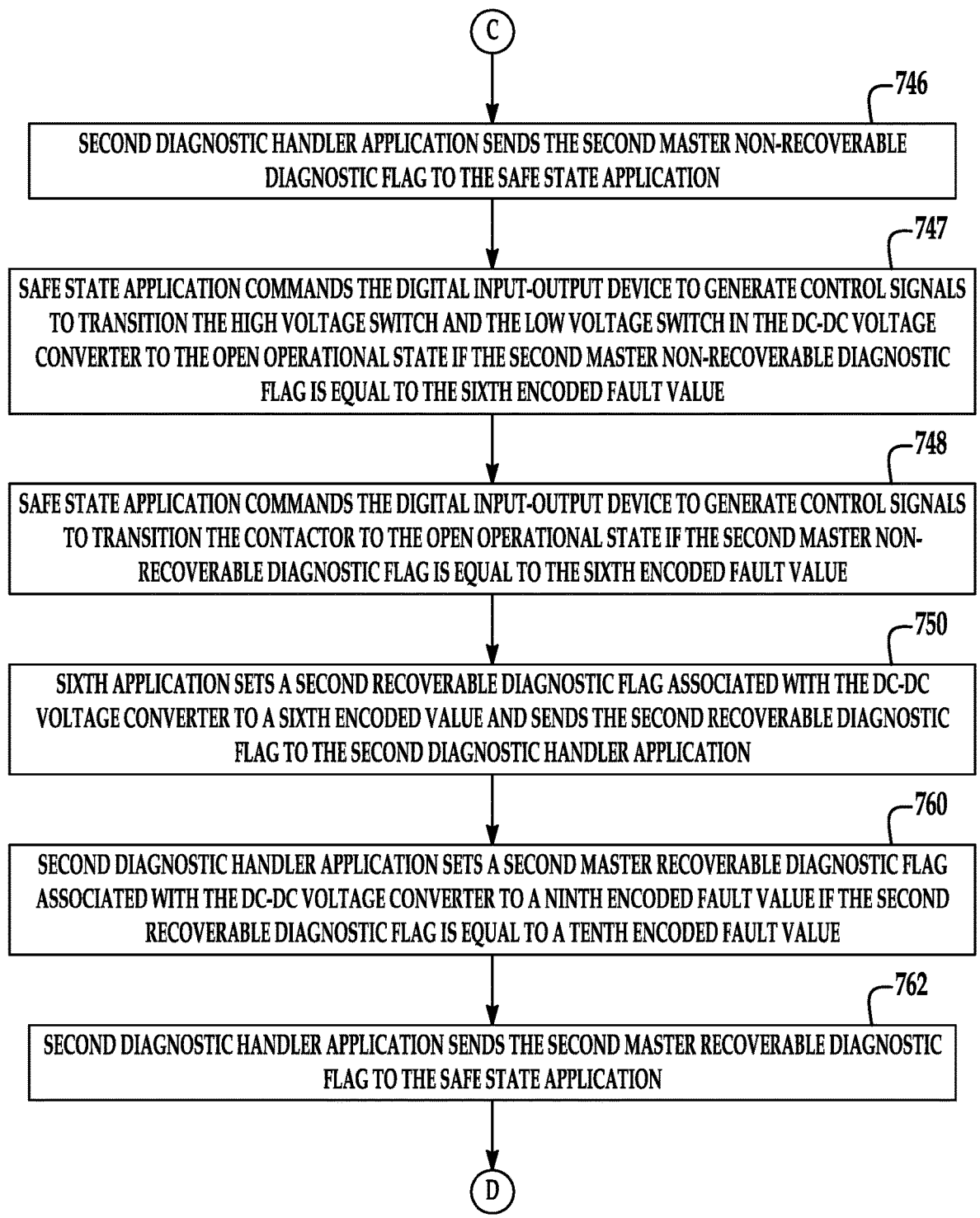
Figure 17:
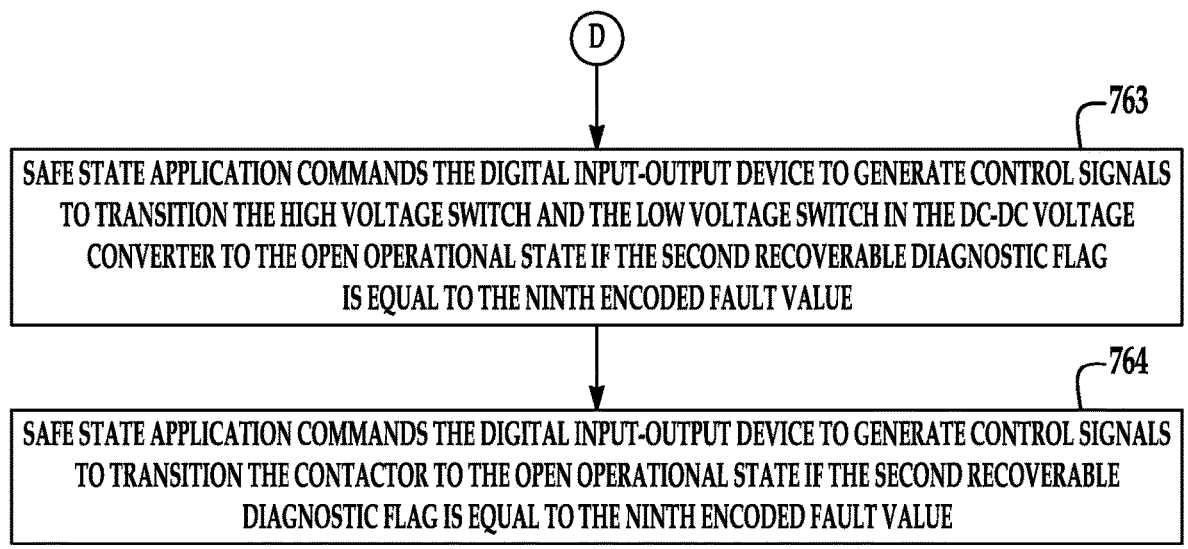

Referring to FIGS. 2 and 12, a table 640 having a record 642 is illustrated. The record 642 has an encoded fault value (e.g., 8E74 hexadecimal), and an encoded non-fault value (e.g., E847 hexadecimal) for a second master recoverable diagnostic flag utilized by the second diagnostic handler application 470 is illustrated.

Referring to FIGS. 3 and 4, the fault values in the tables 550, 560 have a Hamming distance of at least four from one another. Further, the non-fault values in the tables 550, 560 have a Hamming distance of at least four from one another.

Referring to FIGS. 8 and 9, the fault values in the tables 600, 610 have a Hamming distance of at least four from one another. Further, the non-fault values in the tables 600, 610 have a Hamming distance of at least four from one another.

Referring to FIGS. 6 and 11, the fault values in the tables 580, 630 have a Hamming distance of at least four from one another. Further, the non-fault values in the tables 580, 630 have a Hamming distance of at least four from one another.

Referring to FIGS. 7 and 12, the fault values in the tables 590, 640 have a Hamming distance of at least four from one another. Further, the non-fault values in the tables 590, 640 have a Hamming distance of at least four from one another.

Referring to FIGS. 1, 2 and 13-17, a flowchart of a diagnostic method implemented by the diagnostic system 24 will be explained.

At step 700, the microcontroller 380 initializes the following flags:

first non-recoverable diagnostic flag=first encoded non-fault value (e.g., B714 hexadecimal from table 550 in FIG. 3);

second non-recoverable diagnostic flag=second encoded non-fault value (e.g., 359C hexadecimal from table 560 in FIG. 4);

third non-recoverable diagnostic flag=third encoded non-fault value (e.g., 7B82 hexadecimal from table 600 in FIG. 8);

fourth non-recoverable diagnostic flag=fourth encoded non-fault value (e.g., 53C9 hexadecimal from table 610 in FIG. 9);

first recoverable diagnostic flag=fifth encoded non-fault value (e.g., A55A hexadecimal from table 570 in FIG. 5);

second recoverable diagnostic flag=sixth encoded non-fault value (e.g., 5AA5 hexadecimal from table 620 in FIG. 10);

first master non-recoverable diagnostic flag=seventh encoded non-fault value (e.g., B21D hexadecimal from table 580 in FIG. 6);

second master non-recoverable diagnostic flag=eighth encoded non-fault value (e.g., 2BD1 hexadecimal from table 630 in FIG. 11);

first master recoverable diagnostic flag=ninth encoded non-fault value (e.g., 8E74 hexadecimal from table 590 in FIG. 7);

second master recoverable diagnostic flag=tenth encoded non-fault value (e.g., E847 hexadecimal from table 640 in FIG. 12).

At step 702, the first application 400 sets a first non-recoverable diagnostic flag associated with the DC-DC voltage converter 100 to a first encoded value and sends the first non-recoverable diagnostic flag to the first diagnostic handler application 430. The first encoded value has each nibble thereof selected from an odd Karnaugh set of binary values.

For example, if the first application 400 determines that an output voltage of the buck voltage regulator 265 measured by the first analog-to-digital converter 398 at a first time is greater than a first threshold voltage indicating an overvoltage condition, the first encoded value is set to ED41 hexadecimal (from table 550 in FIG. 3). Alternately, if the first application 400 does not determine that the output voltage of the buck voltage regulator 265 is greater than the first threshold voltage, the first encoded value is set to B714 hexadecimal (from table 550 in FIG. 3).

At step 704, the second application 410 sets a second non-recoverable diagnostic flag associated with the DC-DC voltage converter 100 to a second encoded value and sends the second non-recoverable diagnostic flag to the first diagnostic handler application 430. The second encoded value has each nibble thereof selected from an even Karnaugh set of binary values.

For example, if the second application 410 determines that an output voltage (VL) of the DC-DC voltage converter measured by the first analog-to-digital converter 398 at a first time is greater than a first threshold DC-DC voltage indicating an overvoltage condition, the second encoded value is set to 53C9 hexadecimal (from table 560 in FIG. 4). Alternately, if the second application 410 does not determine that the output voltage (VL) of the DC-DC voltage converter is greater than the first threshold DC-DC voltage, the second encoded value is set to 359C hexadecimal (from table 560 in FIG. 4).

At step 706, the first diagnostic handler application 430 sets a first master non-recoverable diagnostic flag associated with the DC-DC voltage converter 100 to a first encoded fault value (e.g., 2BD1 hexadecimal from table 580 in FIG. 6) if the first non-recoverable diagnostic flag is equal to a second encoded fault value (e.g., ED41 hexadecimal), or the second non-recoverable diagnostic flag is equal to a third encoded fault value (e.g., 53C9 hexadecimal).

At step 720, the first diagnostic handler application 430 sends the first master non-recoverable diagnostic flag to a safe state application 480.

At step 721, the safe state application 480 commands a digital input-output device 394 to generate control signals to transition a high voltage switch 250 and a low voltage switch 254 in the DC-DC voltage converter 100 to an open operational state if the first master non-recoverable diagnostic flag is equal to the first encoded fault value.

At step 722, the safe state application 480 commands the digital input-output device 394 to generate control signals to transition a contactor 70 to an open operational state if the first master non-recoverable diagnostic flag is equal to the first encoded fault value.

At step 724, the third application 420 sets a first recoverable diagnostic flag associated with the DC-DC voltage converter 100 to a third encoded value and sends the first recoverable diagnostic flag to the first diagnostic handler application 430.

For example, if the third application 420 determines that the temperature signal (TEMP) from the temperature sensor 266 measured by the first analog-to-digital converter 398 at a first time indicates a temperature level that is greater than a first threshold temperature level, the third encoded value is set to 5AA5 hexadecimal (from table 570 in FIG. 5). Alternately, if the third application 420 does not determine that the temperature signal (TEMP) from the temperature sensor 266 indicates the temperature level is greater than the first threshold temperature level, the third encoded value is set to A55A hexadecimal (from table 570 in FIG. 5).

At step 726, the first diagnostic handler application 430 sets a first master recoverable diagnostic flag associated with the DC-DC voltage converter 100 to a fourth encoded fault value (e.g., E847 hexadecimal from table 590 in FIG. 7) if the first recoverable diagnostic flag is equal to a fifth encoded fault value (e.g., 5AA5 hexadecimal).

At step 728, the first diagnostic handler application 430 sends the first master recoverable diagnostic flag to the safe state application 480.

At step 729, the safe state application 480 commands the digital input-output device 394 to generate control signals to transition the high voltage switch 250 and the low voltage switch 254 in the DC-DC voltage converter 100 to an open operational state if the first master recoverable diagnostic flag is equal to the fourth encoded fault value.

At step 730, the safe state application 480 commands the digital input-output device 394 to generate control signals to transition the contactor 70 to the open operational state if the first master recoverable diagnostic flag is equal to the fourth encoded fault value.

At step 740, the fourth application 440 sets a third non-recoverable diagnostic flag associated with the DC-DC voltage converter 100 to a fourth encoded value and sends the third non-recoverable diagnostic flag to the second diagnostic handler application 470. The fourth encoded value has each nibble thereof selected from the odd Karnaugh set of binary values.

For example, if the fourth application 440 determines that an output voltage (BV) of the buck voltage regulator 265 measured by the first analog-to-digital converter 398 at a second time is greater than a second threshold voltage (which is greater than the first threshold voltage) indicating an overvoltage condition, the fourth encoded value is set to DE28 hexadecimal (from table 600 in FIG. 8). Alternately, if the fourth application 440 does not determine that the output voltage (BV) of the buck voltage regulator 265 is greater than the second threshold voltage, the fourth encoded value is set to 7B82 hexadecimal (from table 600 in FIG. 8).

At step 742, the fifth application 450 sets a fourth non-recoverable diagnostic flag associated with the DC-DC voltage converter 100 to a fifth encoded value and sends the fourth non-recoverable diagnostic flag to the second diagnostic handler application 470. The fifth encoded value has each nibble thereof selected from the even Karnaugh set of binary values.

For example, if the fifth application 450 determines that an output voltage (VL) of the DC-DC voltage converter measured by the second analog-to-digital converter 399 at a second time is greater than a second threshold DC-DC voltage (which is greater than the first threshold DC-DC voltage) indicating an overvoltage condition, the fifth encoded value is set to 359C hexadecimal (from table 610 in FIG. 9). Alternately, if the fifth application 450 does not determine that the output voltage (VL) of the DC-DC voltage converter is greater than the second threshold DC-DC voltage, the fifth encoded value is set to 53C9 hexadecimal (from table 610 in FIG. 9).

At step 744, the second diagnostic handler application 470 sets a second master non-recoverable diagnostic flag associated with the DC-DC voltage converter 100 to a sixth encoded fault value (e.g., B21D hexadecimal from table 630 in FIG. 11) if the third non-recoverable diagnostic flag is equal to a seventh encoded fault value (e.g., DE28 hexadecimal), or the fourth non-recoverable diagnostic flag is equal to an eighth encoded fault value (e.g., 359C hexadecimal).

At step 746, the second diagnostic handler application 470 sends the second master non-recoverable diagnostic flag to the safe state application 480.

At step 747, the safe state application 480 commands the digital input-output device 394 to generate control signals to transition the high voltage switch 250 and the low voltage switch 254 in the DC-DC voltage converter 100 to an open operational state if the second master non-recoverable diagnostic flag is equal to the sixth encoded fault value.

At step 748, the safe state application 480 commands the digital input-output device 394 to generate control signals to transition the contactor 70 to the open operational state if the second master non-recoverable diagnostic flag is equal to the sixth encoded fault value.

At step 750, the sixth application 460 sets a second recoverable diagnostic flag associated with the DC-DC voltage converter 100 to a sixth encoded value and sends the second recoverable diagnostic flag to the second diagnostic handler application 470.

For example, if the sixth application 460 determines that the temperature signal (TEMP) from the temperature sensor 266 measured by the first analog-to-digital converter 398 at a second time indicates a temperature level that is greater than a second threshold temperature level (which is greater than the first threshold temperature level), the sixth encoded value is set to A55A hexadecimal (from table 620 in FIG. 10). Alternately, if the sixth application 460 does not determine that the temperature signal (TEMP) from the temperature sensor 266 indicates a temperature level is greater than the second threshold temperature level, the sixth encoded value is set to 5AA5 hexadecimal (from table 620 in FIG. 10).

At step 760, the second diagnostic handler application 470 sets a second master recoverable diagnostic flag associated with the DC-DC voltage converter 100 to a ninth encoded fault value (e.g., 8E74 hexadecimal from table 640 in FIG. 12) if the second recoverable diagnostic flag is equal to a tenth encoded fault value.

At step 762, the second diagnostic handler application 470 sends the second master recoverable diagnostic flag to the safe state application 480.

At step 763, the safe state application 480 commands the digital input-output device 394 to generate control signals to transition the high voltage switch 250 and the low voltage switch 254 in the DC-DC voltage converter 100 to an open operational state if the second recoverable diagnostic flag is equal to the ninth encoded fault value.

At step 764, the safe state application 480 commands the digital input-output device 394 to generate control signals to transition the contactor 70 to the open operational state if the second recoverable diagnostic flag is equal to the ninth encoded fault value.

The diagnostic system for a DC-DC voltage converter described herein provides a substantial advantage over other systems. In particular, the diagnostic system described herein utilizes non-recoverable diagnostic flags having each nibble thereof selected from an odd Karnaugh set of binary values, and non-recoverable diagnostic flags having each nibble thereof selected from an even Karnaugh set of binary values to allow freedom from interference among the diagnostic flags. Further, the system utilizes recoverable diagnostic flags having each nibble thereof selected from an odd Karnaugh set of binary values, and recoverable diagnostic flags having each nibble thereof selected from an even Karnaugh set of binary values to allow freedom from interference among the diagnostic flags.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a DC-DC voltage converter, comprising:
a microcontroller having a first diagnostic handler application, first and second applications, and a safe state application;
the first application setting a first non-recoverable diagnostic flag associated with the DC-DC voltage converter to a first encoded value and sending the first non-recoverable diagnostic flag to the first diagnostic handler application; the first encoded value having each nibble thereof selected from an odd Karnaugh set of binary values;
the second application setting a second non-recoverable diagnostic flag associated with the DC-DC voltage converter to a second encoded value and sending the second non-recoverable diagnostic flag to the first diagnostic handler application; the second encoded value having each nibble thereof selected from an even Karnaugh set of binary values;
the first diagnostic handler application setting a first master non-recoverable diagnostic flag associated with the DC-DC voltage converter to a first encoded fault value if the first non-recoverable diagnostic flag is equal to a second encoded fault value, or the second non-recoverable diagnostic flag is equal to a third encoded fault value;
the first diagnostic handler application sending the first mater non-recoverable diagnostic flag to the safe state application;
the safe state application transitioning a high voltage switch and a low voltage switch in the DC-DC voltage converter to an open operational state, and a contactor to an open operational state, if the first mater non-recoverable diagnostic flag is equal to the first encoded fault value;
wherein each of the first and second non-recoverable diagnostic flags is a flag which when set to an encoded fault value induces the diagnostic system to take safe action by transitioning the high voltage switch and the low voltage switch in the DC-DC voltage converter to the open operational state, and to transition the contractor to the open operational state to electrically de-couple a battery pack from a vehicle electric load, and the diagnostic system thereafter maintains the high voltage switch, the low voltage switch, and the contactor in the open operational state even if the first and second non-recoverable diagnostic flags are set to an encoded non-fault value;
wherein the off Karnaugh set of values corresponds to numbers having corresponding binary numbers with an off number of 0 bits and an off number of 1 bits in a nibble, and the even Karnaugh set of values corresponds to numbers having corresponding binary numbers with an even number of 0 bits and an even number of 1 bits in a nibble for numbers greater than zero.

2. The diagnostic system of claim 1, wherein:
the microcontroller having a third application, the third application setting a first recoverable diagnostic flag associated with the DC-DC voltage converter to a third encoded value and sending the first recoverable diagnostic flag to the first diagnostic handler application; and
the first diagnostic handler application setting a first master recoverable diagnostic flag associated with the DC-DC voltage converter to a fourth encoded fault value if the first recoverable diagnostic flag is equal to a fifth encoded fault value;
wherein the first recoverable diagnostic flag is a flag which when set to an encoded fault value indices the diagnostic system to take safe action by transitioning the high voltage switch and the low voltage switch in the DC-DC voltage converter to the open operation state, and to transition the contractor to the open operational state to electrically de-couple the batter pack from the vehicle electrical load, and the diagnostic system thereafter transitions the high voltage switch, the low voltage switch, and the contactor to the closed operational state if the first recoverable diagnostic flag is set to an encoded non-fault value.

3. The diagnostic system of claim 2, wherein:
the first diagnostic handler application sending the first master recoverable diagnostic flag to the safe state application; and
the safe state application transitioning the high voltage switch and the low voltage switch in the DC-DC voltage converter to the open operational state if the first master recoverable diagnostic flag is equal to the fourth encoded fault value.

4. The diagnostic system of claim 3, wherein the safe state application transitioning the contactor to the open operational state if the first master recoverable diagnostic flag is equal to the fourth encoded fault value.

5. The diagnostic system of claim 2, wherein:
the microcontroller having a second diagnostic handler application and fourth and fifth applications;
the fourth application setting a third non-recoverable diagnostic flag associated with the DC-DC voltage converter to a fourth encoded value and sending the third non-recoverable diagnostic flag to the second diagnostic handler application; the fourth encoded value having each nibble thereof selected from the odd Karnaugh set of binary values;
the fifth application setting a fourth non-recoverable diagnostic flag associated with the DC-DC voltage converter to a fifth encoded value and sending the fourth non-recoverable diagnostic flag to the second diagnostic handler application; the fifth encoded value having each nibble thereof selected from the even Karnaugh set of binary values; and
the second diagnostic handler application setting a second master non-recoverable diagnostic flag associated with the DC-DC voltage converter to a sixth encoded fault value if the third non-recoverable diagnostic flag is equal to a seventh encoded fault value, or the fourth non-recoverable diagnostic flag is equal to an eighth encoded fault value;
wherein the second recoverable diagnostic flag is a flag which when set to an encoded fault value induces the diagnostic system to take safe action by transitioning the high voltage switch and the low voltage switch in the DC-DC voltage converter to the open operational state, and to transition the contactor to the open operational state to electrically de-couple the battery pack from the vehicle electrical load, and the diagnostic system thereafter transitions the high voltage switch, the low voltage switch, and the contactor to a closed operational state if the second recoverable diagnostic flag is set to an encoded non-fault value.

6. The diagnostic system of claim 5, wherein:
the second diagnostic handler application sending the second master non-recoverable diagnostic flag to the safe state application; and
the safe state application transitioning the high voltage switch and the low voltage switch in the DC-DC voltage converter to the open operational state if the second master non-recoverable diagnostic flag is equal to the sixth encoded fault value.

7. The diagnostic system of claim 6, wherein the safe state application transitioning the contactor to the open operational state if the second master non-recoverable diagnostic flag is equal to the sixth encoded fault value.

8. The diagnostic system of claim 5, wherein:
the microcontroller having a sixth application, the sixth application setting a second recoverable diagnostic flag associated with the DC-DC voltage converter to a sixth encoded value and sending the second recoverable diagnostic flag to the second diagnostic handler application; and
the second diagnostic handler application setting a second master recoverable diagnostic flag associated with the DC-DC voltage converter to a ninth encoded fault value if the second recoverable diagnostic flag is equal to a tenth encoded fault value;
wherein the second recoverable diagnostic flag is a flag which when set to an encoded fault value induces the diagnostic system to take safe action by transitioning the high voltage switch and the low voltage switch in the DC-DC voltage converter to the open operational state, and to transition the contactor to the open operational state to electrically de-couple the battery pack from the vehicle electrical load, and the diagnostic system thereafter transitions the high voltage switch, the low voltage switch, and the contractor to a closed operational state if the second recoverable diagnostic flag is set to an encoded non-fault value.

9. The diagnostic system of claim 8, wherein:
the second diagnostic handler application sending the second master recoverable diagnostic flag to the safe state application; and
the safe state application transitioning the high voltage switch and the low voltage switch in the DC-DC voltage converter to the open operational state if the second master recoverable diagnostic flag is equal to the ninth encoded fault value.

10. The diagnostic system of claim 9, wherein the safe state application transitioning the contactor to the open operational state if the second master recoverable diagnostic flag is equal to the ninth encoded fault value.

11. The diagnostic system of claim 8, wherein the first and second non-recoverable diagnostic flags have a Hamming distance of at least four from one another.

12. The diagnostic system of claim 8, wherein the third and fourth non-recoverable diagnostic flags have a Hamming distance of at least four from one another.

13. The diagnostic system of claim 8, wherein the first and second master non-recoverable diagnostic flags have a Hamming distance of at least four from one another.

14. The diagnostic system of claim 8, wherein the first and second recoverable diagnostic flags have a Hamming distance of at least four from one another.

* * * * *